(12) United States Patent
Zhao et al.

(10) Patent No.: US 11,177,298 B2
(45) Date of Patent: Nov. 16, 2021

(54) TFT DRIVING BACKPLANE

(71) Applicant: WUHAN CHINA STAR OPTOELECTRONICS SEMICONDUCTOR DISPLAY TECHNOLOGY CO., LTD., Hubei (CN)

(72) Inventors: Jiaxiang Zhao, Wuhan (CN); Wenjin Cheng, Wuhan (CN); Keran Jia, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 16/637,796

(22) PCT Filed: Jan. 24, 2019

(86) PCT No.: PCT/CN2019/072890
§ 371 (c)(1),
(2) Date: Feb. 10, 2020

(87) PCT Pub. No.: WO2020/118876
PCT Pub. Date: Jun. 18, 2020

(65) Prior Publication Data
US 2020/0286932 A1    Sep. 10, 2020

(30) Foreign Application Priority Data
Dec. 13, 2018   (CN) .......................... 201811524346.6

(51) Int. Cl.
*H01L 29/04*    (2006.01)
*H01L 27/12*    (2006.01)
*H01L 27/32*    (2006.01)

(52) U.S. Cl.
CPC ...... *H01L 27/1255* (2013.01); *H01L 27/3265* (2013.01); *H01L 27/3276* (2013.01)

(58) Field of Classification Search
CPC  H01L 27/255; H01L 27/3265; H01L 27/3276
See application file for complete search history.

(56) References Cited

U.S. PATENT DOCUMENTS

2002/0045311 A1* 4/2002 Mikawa ................. H01L 28/60
                                                                  438/240
2003/0001177 A1* 1/2003 Okutoh ............. H01L 21/31604
                                                                  257/295

(Continued)

FOREIGN PATENT DOCUMENTS

CN         102394240 A      3/2012
CN         104882449 A      9/2015

(Continued)

*Primary Examiner* — Phuc T Dang
(74) *Attorney, Agent, or Firm* — The Roy Gross Law Firm, LLC; Roy Gross

(57) ABSTRACT

Provided is a TFT driving backplane including, in top-to-bottom order, a sub-data line, a first insulating layer, a top capacitor plate, a second insulating layer and a bottom capacitor plate. In one side of the top capacitor plate is provided a notch filled upward by the first insulating layer provided with a first via extending vertically downward to the bottom capacitor plate. By moving the position where the sub-data line and the bottom capacitor plate are connected away from the top capacitor plate, holing is not required to be performed at the center of the capacitor and two-step opening alignment is avoided. Consequently, the requirement for alignment precision in photolithography is less critical, and the deviation due to two-step opening alignment is prevented. Meanwhile, by designing the margin and the one-way deviation, the short circuit in the capacitor can be avoided, and the effective capacitive area can be increased.

8 Claims, 4 Drawing Sheets

(56) References Cited

U.S. PATENT DOCUMENTS

| | | |
|---|---|---|
| 2003/0007107 A1 | 1/2003 | Chae |
| 2007/0108553 A1* | 5/2007 | Kuwajima .............. H01L 28/40 |
| | | 257/532 |
| 2013/0242239 A1* | 9/2013 | Chang ................. G02F 1/13439 |
| | | 349/106 |
| 2014/0049714 A1 | 2/2014 | Yoshida |
| 2016/0148985 A1* | 5/2016 | Park .................... H01L 27/3262 |
| | | 257/40 |
| 2017/0040353 A1 | 2/2017 | Lv et al. |
| 2018/0012948 A1* | 1/2018 | Lee .................... H01L 27/1251 |

FOREIGN PATENT DOCUMENTS

| | | |
|---|---|---|
| CN | 107331669 A | 11/2017 |
| WO | 2012147722 A1 | 11/2012 |

\* cited by examiner

TFT DRIVING BACKPLANE

FIELD OF INVENTION

The present invention generally relates to the display technology and, more particularly, to a TFT driving backplane.

BACKGROUND OF INVENTION

The flexible organic light-emitting diode (OLED) display technology has advantages such as wide color gamut, high contrast, large viewing angle, fast response rate, light weight, etc., and has thus gradually replaced thin-film transistor liquid-crystal displays (TFT-LCDs). In applications like mobile phones, watches, pads, etc., with the consumer's preference for large displays, the demand for larger screen-to-body ratio has become higher. The most distinct advantage of the OLED technology is that it provides a flexible display through the PI process.

For an active-matrix organic light-emitting diode (AMO-LED), the low-temperature poly-silicon (LTPS) process is generally used to manufacture a thin-film transistor (TFT) driving backplane required for an OLED. The 7T1C driver circuit, as shown in FIG. 1, is commonly used as a driver circuit.

As shown in FIG. 2, a part of the layout design of LTPS devices in the 7T1C driver circuit commonly used in the industry is illustrated, which includes a first via 8, a second via 9, a third via 10, a fourth via 11, a fifth via 12, a sixth via 13, a seventh via 14, and an eighth via 15.

Taking the first via 8 as an example, the first via 8 is configured to connect a sub-data line (SD) and a bottom capacitor plate 4 (GE1). During the process for manufacturing the first via 8, two-step holing is required. The first holing is performed directly above the capacitor structure. More particularly, the first holing is conducted on a top capacitor plate 3 (GE2), and the second holing is conducted after a first insulating layer 2 (for example, an ILD layer) is formed so as to form a first opening 6 and a second opening 7 under the first opening 6.

The cross-sectional view is shown in FIG. 3. In order to connect the sub-data line (SD) 1 and the bottom capacitor plate 5, two-step holing is required to be performed directly above the capacitor structure during the process. The first opening 6 penetrates the first insulating layer 2 (for example, an ILD layer) and the top capacitor plate 3. The second opening 7 is provided under the first opening 6, and the bottom of the second opening 7 meets the upper surface of the top capacitor plate 3. The first opening 6 and the second opening 7 are formed by two-step holing. If a slight deviation occurs in the alignment of the second opening 7 and the first opening 6, a short circuit will be formed between the bottom capacitor plate 5 and the top capacitor plate 3. Therefore, the requirement for photolithography (PH) and etching is very strict. Moreover, the design requires that the diameter of the first opening 6 to be sufficiently large and the diameter of the second opening 7 to be as small as possible. If the diameter of the first opening 6 is too large, the capacitive area will be reduced. In the circuit design, only the first opening 6 requires two-step alignment. Accordingly, the requirement for alignment precision during photolithography and etching is extremely strict.

As shown in FIG. 4, the design requires that the bottom capacitor plate 5 has a wide side length of 12 µm, a long side length of 20 µm, and an area of 12*20 µm². The first opening 6 has a diameter of 6 µm. The second opening 7 has a diameter of 2 µm. The actual deviation distance (CD) between the first opening 6 and the second opening 7 is 2 µm. When the PH overlay is larger than 1.5 µm, a short circuit in the capacitor may occur.

In the prior art, two-step holing is required to be performed at the center of the capacitor so as to connect the sub-data line and the bottom capacitor plate. The requirement for alignment precision during photolithography is extremely strict, because alignment deviation is likely to cause a short circuit in the capacitor, low product yield, and effective capacitive area loss. Accordingly, the present invention provides a TFT driving backplane to solve the foregoing problems.

SUMMARY OF INVENTION

In order to achieve the foregoing object, the present invention provides the following technical solutions:

In one embodiment of the present invention, a TFT driving backplane is provided, which includes in top-to-bottom order: a sub-data line, a first insulating layer, a top capacitor plate, a second insulating layer and a bottom capacitor plate. In one side of the top capacitor plate is provided a notch filled upward by the first insulating layer provided with a first via extending vertically downward to the bottom capacitor plate.

Furthermore, the notch is provided in one corner of the top capacitor plate.

Furthermore, the notch is a square.

Furthermore, the square has a side length of 3 to 6 µm.

Furthermore, the square has a side length of 4 µm.

Furthermore, the first insulating layer covers the top capacitor plate and is provided with an opening of the first via thereon.

Furthermore, the opening of the first via has a diameter of 1 to 3 µm.

Furthermore, the opening of the first via has a diameter of 2 µm.

Furthermore, the sub-data line is electrically connected to the bottom capacitor plate through the first via.

Furthermore, the first via has a diameter smaller than each side length of the notch.

The present invention provides a TFT driving backplane, in which the position where the sub-data line and the bottom capacitor plate are connected is moved away from the top capacitor plate such that holing is not required to be performed at the center of the capacitor and two-step opening alignment is avoided. Consequently, the requirement for alignment precision in photolithography is less critical, and the deviation due to two-step opening alignment is prevented to cause a short circuit in the capacitor, thereby improving the product yield. At the same time, by designing the margin and the one-way deviation, the short circuit in the capacitor can be avoided, and the effective capacitive area can be increased.

DESCRIPTION OF DRAWINGS

In order to more clearly illustrate the embodiments or the technical solutions in the prior art, the drawings used in the embodiments or the prior art description will be briefly described below. Obviously, the drawings in the following description are only some implementations of the present invention. For example, other drawings may be obtained, without creative efforts, by those of ordinary skill in the art in light of the inventive work.

Figure 1:
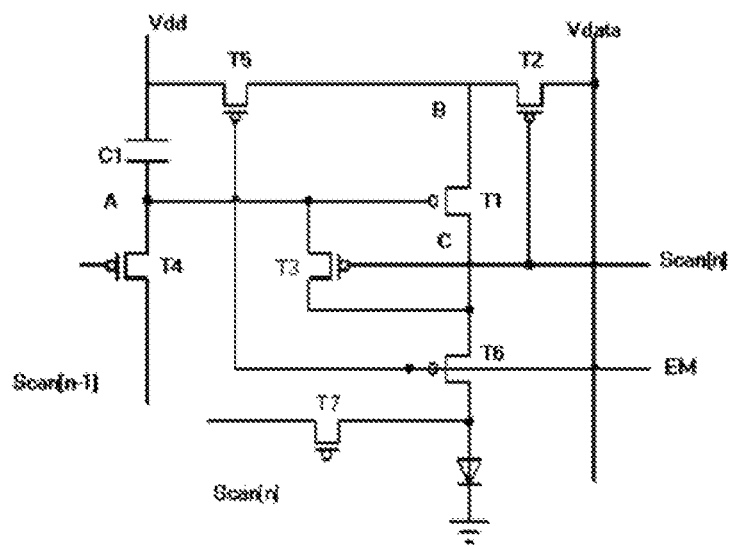
FIG. 1 is a schematic circuit diagram of a 7T1C driver circuit of a conventional TFT driving backplane.
Figure 2:
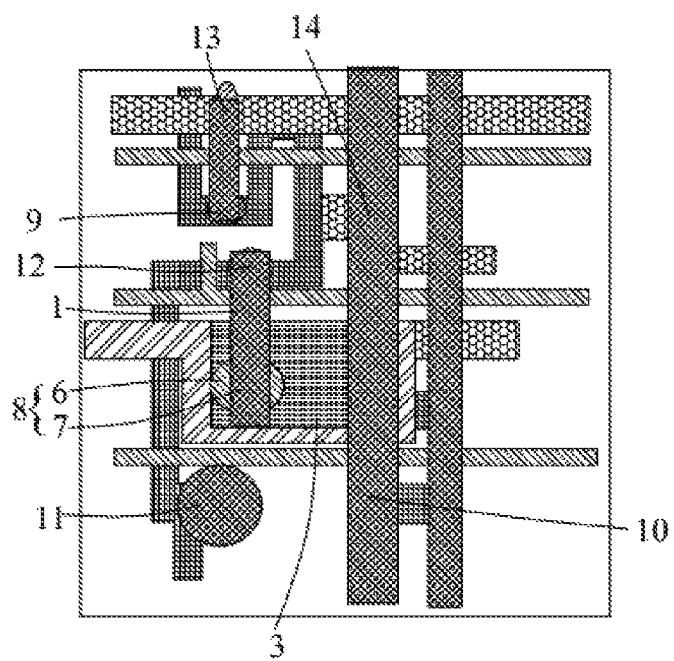
FIG. 2 is a schematic view showing a part of the layout design of LTPS devices in the 7T1C driver circuit of a conventional TFT driving backplane.
Figure 3:
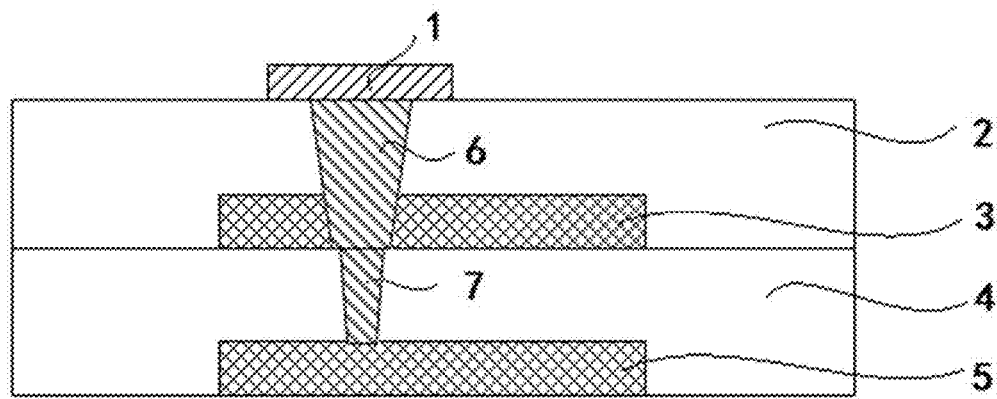
FIG. 3 is a cross-sectional view showing the opening structure of a conventional TFT driving backplane.
Figure 4:
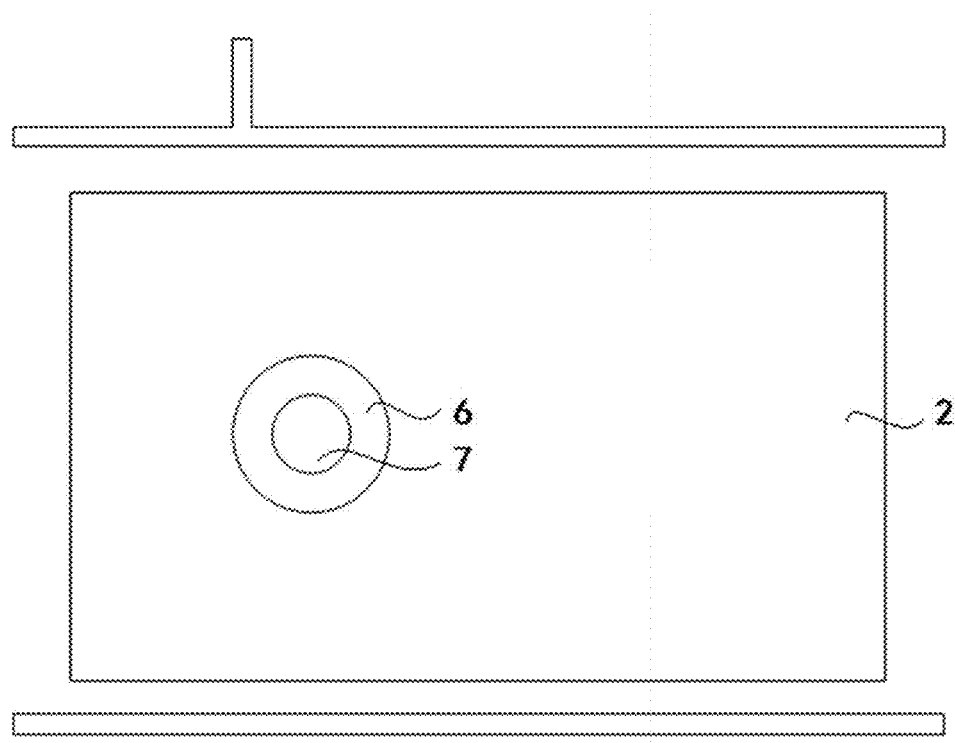
FIG. 4 is a top view showing the opening structure of a conventional TFT driving backplane.

The elements in the drawings are identified as follows:

1 sub-data line, 2 first insulating layer, 3 top capacitor plate, 4 second insulating layer, 5 bottom capacitor plate, 6 first opening, 7 second opening, 8 first via, 9 second via, 10 third via, 11 fourth via, 12 fifth via, 13 sixth via, 14 seventh via, 15 eighth via.

DETAILED DESCRIPTION OF PREFERRED EMBODIMENTS

The following descriptions of the various embodiments with reference to the accompanying drawings exemplify particular embodiments of the present invention. The directional terms mentioned in this specification, such as "upper", "lower", "front", "rear", "left", "right", "inner", "outer", "side", etc., only illustrate the directions in the accompanying drawings. Therefore, the directional terms are used for the purpose of illustration and understanding of the present invention, instead of limiting the present invention. In the drawings, like reference numerals represent the same structural elements.

Figure 5:
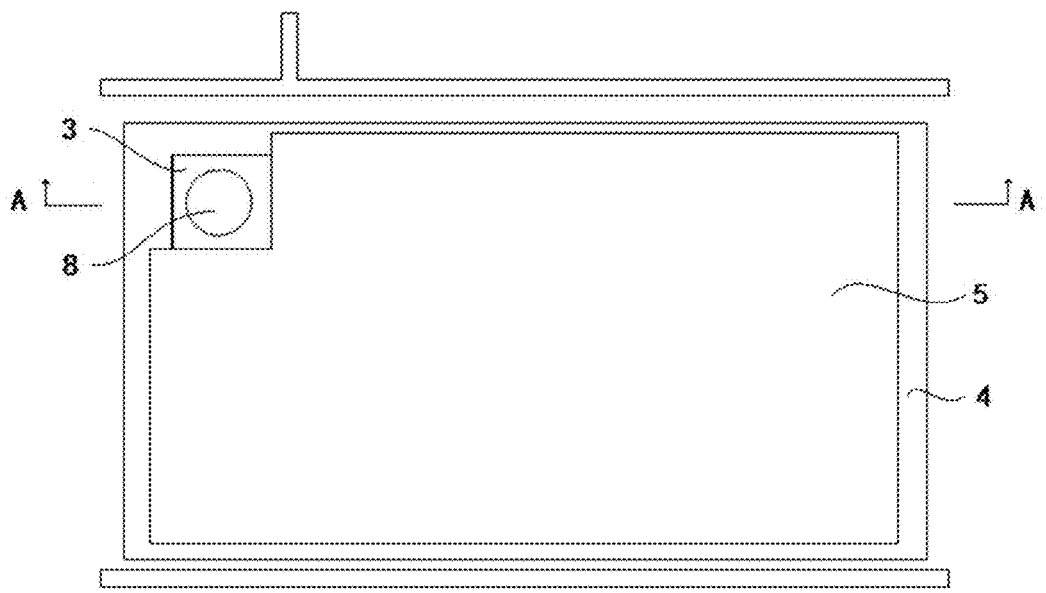
FIG. 5 is a top view showing an open structure of a TFT driving backplane according to one embodiment of the present invention.
Figure 6:
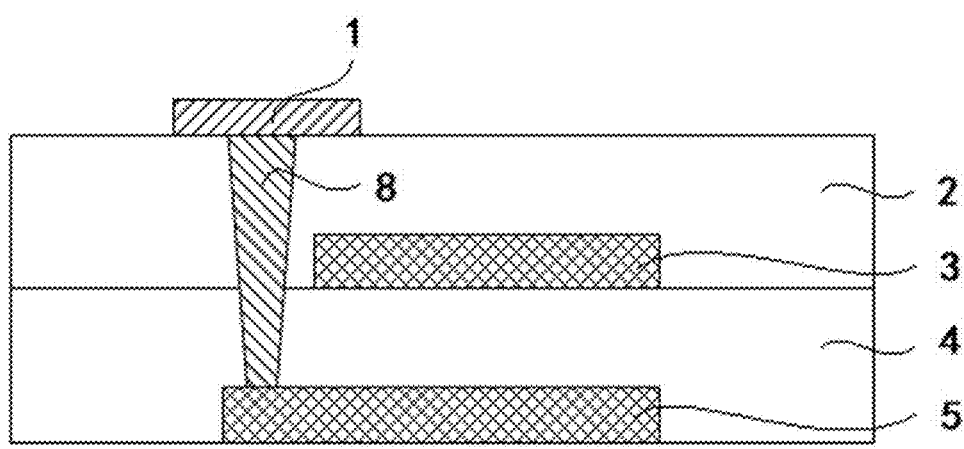
FIG. 6 is a cross-sectional view of a TFT driving backplane along A-A of FIG. 5 according to one embodiment of the present invention.

Referring to FIG. 5 and FIG. 6, in one embodiment of the present invention, a TFT driving backplane is provided, which includes, in top-to-bottom order, a sub-data line 1, a first insulating layer 2, a top capacitor plate 3, a second insulating layer 4 and a bottom capacitor plate 5. In one side of the top capacitor plate 3 is provided a notch filled upward by the first insulating layer 2 provided with a first via 8 extending vertically downward to the bottom capacitor plate 5.

The notch is provided in one corner or in one side of the top capacitor plate 3.

The notch is rectangular. Preferably, the notch is a square. The square is arranged in such a way that the first via 8 is formed to coincide with the range of deviation distance from each side.

The square has a side length of 3 to 6 μm. Preferably, the square has a side length of 4 μm.

The first insulating layer 2 covers the top capacitor plate 3 and is provided with an opening of the first via 8 thereon.

The opening of the first via 8 has a diameter of 1 to 3 μm. Preferably, the opening of the first via 8 has a diameter of 2 μm.

The sub-data line 1 is electrically connected to the bottom capacitor plate 5 through the first via 8.

The first via 8 has a diameter smaller than each side length of the notch.

In a preferred embodiment of the present invention, the first via 8 is away from where the top capacitor plate 3 and the bottom capacitor plate 5 of the capacitor are overlapped. The first via 8 is formed by photolithography. Such design does not require two overlapped opening to be aligned. The requirement for photolithography and etching is simple except that the opening of the inorganic insulating layer is offset toward the notch in the upper left corner of the top capacitor plate 3 and a certain margin is provided, thereby ensuring that no short circuit in the capacitor due to two-step alignment during photolithography occurs. Consequently, product performance and yield can be improved. For example, the design requires that the bottom capacitor plate 5 has a wide side length W of 12 μm, a long side length L of 20 μm, and an area of 12*20 μm². The notch in the upper left corner of the top capacitor plate 3 is a square. The square has a side length of 4 μm, and the opening of the first via 8 has a diameter of 2 μm. This ensures that the opening can meet the requirement when the margin is in the range of 2 μm and the effective capacitive area is S=W*L=12*20=226 μm² without changing the size of the bottom capacitor plate 5. That is, the actual effective capacitive area is 226 μm². In addition, in the prior art, the diameter of the first opening 6 is 6 μm, the diameter of the second opening 7 is 2 μm, and the effective capacitive area is S=W*L−π(D/2)2=12*20−9π=211.72 μm². Consequently, the actual effective capacitive area of the present invention is also significantly increased.

Figure 7:
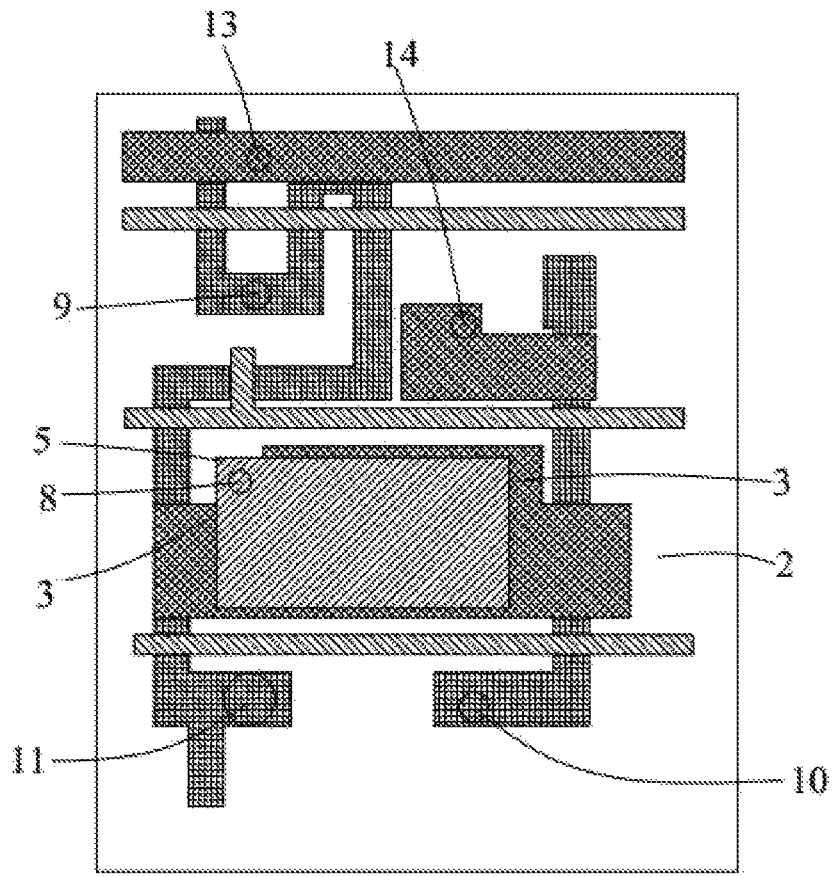
FIG. 7 is a schematic view showing a part of the layout design of LTPS devices in the 7T1C driver circuit of a TFT driving backplane according to one embodiment of the present invention.

Please refer to FIG. 7, which is a schematic view showing a part of the layout design of LTPS devices in the 7T1C driver circuit of a TFT driving backplane according to one embodiment of the present invention. The corresponding structure of the bottom capacitor plate 5 remains unchanged as compared to the prior art, while the top capacitor plate 3 of the present invention changes in that a notch is provided in a corner of the top capacitor plate 3, which is required for the holing process for subsequent ILD connection. As shown in the drawing, the first via 8 is formed in the bottom capacitor plate 5 through the notch. Furthermore, in other embodiments, the margin of exposure can be adjusted toward the upper left of the image during ILD etching or the margin of the opening can be designed toward the upper left to ensure that the opening does not cause a short circuit in the capacitor due to exposure alignment shift so as to increase the capacitive area. Subsequent design of other vias, such as the second via 9, the third via 10, the fourth via 11, the fifth via 12, the sixth via 13, the seventh via 14, the eighth via 15, etc., can remain unchanged based on the original structure. To avoid unnecessary duplication, descriptions thereof will not be redundantly repeated herein.

The present invention distinguishes from the prior art in that it provides a TFT driving backplane, in which the position where the source/drain electrode and the bottom capacitor plate are connected is moved away from the top capacitor plate such that holing is not required to be performed at the center of the capacitor and two-step opening alignment is avoided. Consequently, the requirement for alignment precision in photolithography is less critical, and the deviation due to two-step opening alignment is prevented to cause a short circuit in the capacitor, thereby improving the product yield. At the same time, by designing the margin and the one-way deviation, the short circuit in the capacitor can be avoided, and the effective capacitive area can be increased.

The above description is only a preferred embodiment of the present invention, and it should be noted that those skilled in the art can make various modifications without departing from the spirit and scope of the instant disclosure. Changes and modifications are intended to be included within the scope of the instant disclosure as defined by the appended claims.

What is claimed is:

1. A thin-film transistor (TFT) driving backplane, comprising, in top-to-bottom order: a sub-data line, a first insulating layer, a top capacitor plate, a second insulating layer and a bottom capacitor plate, wherein in one side of the top capacitor plate is provided a notch filled upward by the first insulating layer provided with a first via extending vertically downward to the bottom capacitor plate;

wherein a surface of the bottom capacitor plate and a surface of the top capacitor plate are substantially planar;

wherein the sub-data line is electrically connected to the bottom capacitor plate through the first via.

2. The TFT driving backplane of claim 1, wherein the notch is provided in one corner of the top capacitor plate.

3. The TFT driving backplane of claim 1, wherein the notch is a square.

4. The TFT driving backplane of claim 3, wherein the square has a side length of 3 to 6 μm.

5. The TFT driving backplane of claim 4, wherein the square has a side length of 4 μm.

6. The TFT driving backplane of claim 1, wherein the first insulating layer covers the top capacitor plate and is provided with an opening of the first via therein.

7. The TFT driving backplane of claim 6, wherein the opening of the first via has a diameter of 1 to 3 μm.

8. The TFT driving backplane of claim 6, wherein the opening of the first via has a diameter of 2 μm.

* * * * *